United States Patent
Boos et al.

(10) Patent No.: US 7,635,879 B2
(45) Date of Patent: Dec. 22, 2009

(54) INALASSB/INGASB AND INALPSB/INGASB HETEROJUNCTION BIPOLAR TRANSISTORS

(75) Inventors: John Bradley Boos, Springfield, VA (US); Brian R. Bennett, Arlington, VA (US); Paul Campbell, Alexandria, VA (US); Richard Magno, Waldorf, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 207 days.

(21) Appl. No.: 11/239,438

(22) Filed: Sep. 20, 2005

(65) Prior Publication Data

US 2006/0065952 A1 Mar. 30, 2006

Related U.S. Application Data

(60) Provisional application No. 60/615,119, filed on Sep. 30, 2004.

(51) Int. Cl.
*H01L 29/40* (2006.01)
(52) U.S. Cl. .................. 257/197; 257/47; 257/E29.033
(58) Field of Classification Search .................. 257/47, 257/197, 273, 565–593, E29.033
See application file for complete search history.

(56) References Cited

U.S. PATENT DOCUMENTS

2002/0070390 A1* 6/2002 Chow ........................ 257/197

OTHER PUBLICATIONS

Magn et al. "inAlAsSb/InGaSb double heterojunction bipolar transistor," Electronic Letters vol. 41 issue 6 Mar. 17, 2005.*
Magno et al. Atimony-based Quaternary Alloys for High-Speed Low-Power Electronic Devices, IEEE High Preformance Device Proceedings, p. 288-296, 2002.*

* cited by examiner

*Primary Examiner*—Davienne Monbleau
*Assistant Examiner*—Matthew Reames
(74) *Attorney, Agent, or Firm*—John Karasek; Stephen T. Hunnius

(57) ABSTRACT

This invention pertains to heterojunction bipolar transistors containing a semiconductor substrate, a buffer layer of an antimony-based material deposited on the substrate, a sub-collector layer of an antimony-based material deposited on the buffer layer, a collector layer of an antimony-based material deposited on the sub-collector layer, a base layer of an antimony-based material deposited on the collector layer, an emitter layer of an antimony-based material deposited on the base layer, and a cap layer of an antimony-based material deposited on the emitter layer.

6 Claims, 2 Drawing Sheets

INALASSB/INGASB AND INALPSB/INGASB HETEROJUNCTION BIPOLAR TRANSISTORS

CROSS REFERENCE TO RELATED APPLICATIONS

This patent application claims the benefit of U.S. Provisional Application No. 60/615,119 filed Sep. 30, 2004.

BACKGROUND OF THE INVENTION

1. Field of the Invention

This invention pertains to heterojunction bipolar transistors (HBTs) that employ advanced antimony-based material designs.

2. Description of Related Art

Future generations of microwave and millimeter-wave radar, communications, electronic warfare, smart weapons and imaging systems will require higher precision, smaller size, increased bandwidth, lower operating voltages and lower cost of production. To meet the demand for improved high-frequency performance, considerable effort within the past ten years or so has focused on the development of GaAs-based and InP-based heterojunction bipolar transistors. As a result, a variety of HBT analog and digital circuits have been fabricated which exhibit higher gain and switching speeds with lower power dissipation. Some of the primary factors responsible for the improved HBT performance have been the use of InGaAs or GaAsSb materials in the base to improve the charge transport through the base and to lower the emitter-base and collector-base voltages needed to obtain a high collector current. As a result of these improvements, InP-based HBTs have distinct high-speed logic circuit performance advantages compared to GaAs-based HBTs and they have set records for the maximum frequency of operation for any three-terminal semiconductor device.

In the longer term, HBTs that employ $In_zGa_{1-z}Sb$ in the base and $In_xAl_{1-x}As_{1-x}As_ySb_{1-y}$ or $In_xAl_{1-x}P_ySb_{1-y}$ material in the emitter along with $In_zGa_{1-z}Sb$, or $In_vAl_{1-v}As_wSb_{1-w}$ or $In_vAl_{1-v}P_wSb_{1-w}$ in the collector may be more attractive than InP-based HBTs for some of the above applications due to the substantially improved electronic properties of these new material systems.

OBJECTS AND BRIEF SUMMARY OF THE INVENTION

It is an object of this invention to provide transistors that employ advanced material designs using antimony-based materials to increase operating speeds.

It is another object of this invention to provide heterojunction bipolar transistors using antimony-based materials to reduce power dissipation.

It is another object of this invention to provide heterojunction bipolar transistors wherein base, emitter and collector layers in each is an antimony-based material.

It is another object of this invention to provide heterojunction bipolar transistors that can operate at switching speed on the order of 500 GHz and are suitable for logic circuits.

These and other objects of this invention can be attained by heterojunction bipolar transistors that use antimony-based materials in the collector, the base and the emitter layers.

DETAILED DESCRIPTION OF THIS INVENTION

Figure 1:
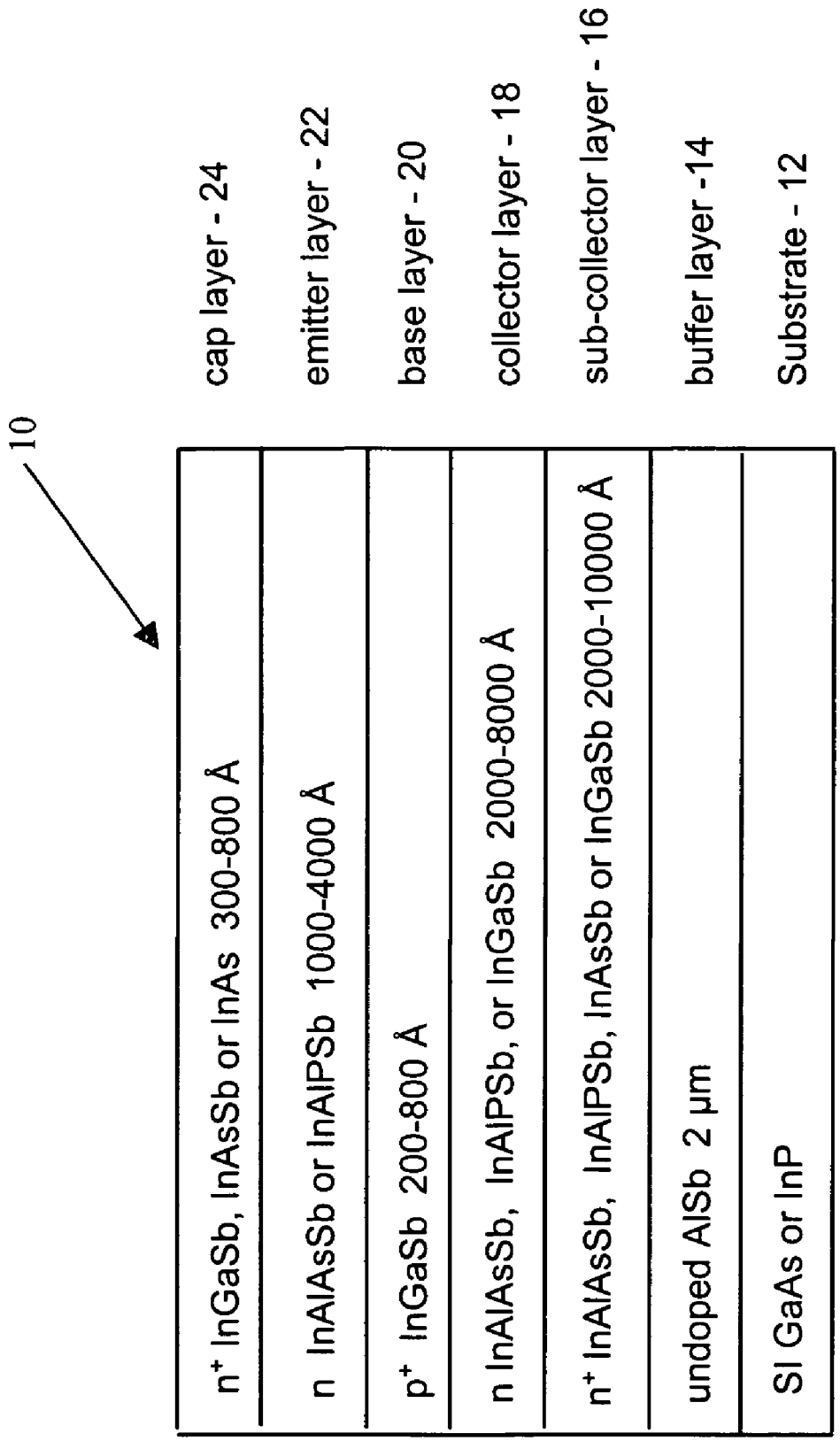
FIG. 1 is a cross-sectional schematic representation of a layer diagram of a heterojunction transistor of this invention.

Heterojunction bipolar transistors of this invention employ advanced material layer designs to increase operating speed and reduce power dissipation. The HBTs utilize InAlAsSb or InAlPSb for the emitter layers, and InGaSb for the base layers and InAlAsSb, InAlPSb and InGaSb for the collector layers. As a result, the transistor devices of this invention exhibit high frequency performance and operate at lower bias voltage. More specifically, the HBTs of this invention, where electrons flow vertically through the HBT device as shown in FIG. 1, include, as shown in FIG. 1, a semi-insulating substrate 12 of GaAs, or InP of the HBT device 10; a buffer layer 14 of un-doped AlSb deposited on the substrate; sub-collector layer 16 of highly doped ($n^+$) InAlAsSb, InAlPSb, InGaSb, or InAsSb deposited on the buffer layer; collector layer 18 of doped (n) InAlAsSb, InAlPSb, or InGaSb deposited on the sub-collector layer; base layer 20 of highly doped ($p^+$) InGaSb; and emitter layer 22 of doped (n) InAlAsSb or InAlPSb deposited on the base layer; and cap layer 24 of highly doped ($n^+$) InGaSb, InAsSb, or InAs deposited on the emitter layer. In a preferred embodiment, the mol fraction x in the material $In_xGa_{1-x}Sb$ are in the range of x of 0.1 to 0.5. In materials $In_xAl_{1-x}As_ySb_{1-y}$ and $In_xAl_{1-x}P_ySb_{1-y}$, mol fractions x and y are in the ranges of 0.4 to 0.8 for x and 0.2 to 0.5 for y. Thickness of the various layers is typically in the following ranges:

substrate 12, 475-525 µm
buffer 14, 1-2 µm
sub-collector 16, 2000-8000 Å
collector 18, 2000-10000 Å
base 20, 200-1000 Å
emitter 22, 1000-4000 Å
cap 24, 100-500 Å

Function of the substrate is obviously to provide support for the layers deposited thereon. Available substrates include GaAs, InP and GaSb. Lattice constants of the first two are in the range of 5.7-5.9 Å and they are semi-insulating (SI) whereas lattice constant of GaSb is 6.1, which is closest to the desired lattice constant and that is why GaSb which is unintentionally doped p-type is sometimes used in the proof of the principle experiments.

Function of the buffer layer is to accommodate lattice mismatch between layers of the device and the substrate. The lattice mismatch function is the principal reason why the buffer layer thickness is typically on the order of 1 to 2 µm. The buffer layer material may be AlSb, step or continuously graded InAlSb, or InAlAsSb, or contain portions that are short period superlattices.

In reference to the sub-collector layer, a high conductivity layer is needed to take current out of the device. This is facilitated by highly doping the sub-collector layer with tellurium and choosing a semiconductor with a high electron mobility. The high doping level, and the choice of a narrow bandgap semiconductor help to produce good quality ohmic metal contacts to the collector. While the main function of the sub-collector layer is to carry current out of the device, it can also be used, i.e., double use, as a portion of the buffer layer to accommodate lattice mismatch.

In reference to the collector layer, one needs to set the conduction band alignment between the base layer and the collector layer to get good device performance. The bandgap of the collector needs to be large enough to support the voltage drop across the collector. The doping level, electron mobility and layer thickness should be appropriate so that electrons can be transported there quickly across the collector. Function of the collector layer is to collect electrons that travel through the base layer.

By changing potential applied to the highly doped ($p^+$) base layer, one gets current to flow from the emitter layer to the collector layer. Typically the InGaSb base is heavily doped with Be to about $10^{19}$ cm$^{-3}$ and it is on the order of 200 to 700 Å thick.

The base layer is necessary for operation of this device since the base-emitter forms a forward based p-n junction and the base-collector forms a reverse biased p-n junction. When a bias is applied to the base it controls the current that flows from the emitter to the collector.

The emitter layer has to have its conduction and valence bands carefully tailored to the conduction and valence bands in the base to optimize the HBT's performance. A wide range of conduction band offsets relative to the base is available with the quaternary material (InAlAsSb) by adjusting the In/Al and As/Sb ratios while maintaining the lattice match of the emitter and base. In addition, a desirable large valence band offset is maintained, almost independent of the In/Al and In/Al composition. The emitter doping is important in order to obtain a large current flow to the collector. Near the base the emitter doping helps to determine the depletion layer thickness. The doping level also helps to minimize the resistance of the emitter. The emitter layer needs to be thin and have a high conductivity to limit parasitic series resistances. Similarly, it is important to have low resistance ohmic contacts to the emitter. The cap layer is used to help make low resistance ohmic contacts to the emitter layer. The cap needs to be composed of a heavily doped narrow bandgap semiconductor in order to have quality ohmic contacts between the external metal wires and the emitter layer Advantages of this invention include attractive material and design features, such as: InGaSb band-gap that can be tailored from 0.3 to 0.7 eV for optimum low voltage operation at emitter-base voltages from 0.1 to 0.5 V; the high hole mobility in the InGaSb results in low parasitic base resistance; a large valence band offset from 0.3 to 0.45 eV at the emitter prevents unwanted hole currents from flowing from the base to the emitter; the InAlAsSb composition of the emitter can be chosen to optimize the conduction band offset to the base; the chemical etching differences between InGaSb and InAlAsSb can be used to optimize an etch stop fabrication process; the InGaSb Fermi-level is pinned near the valence band edge at the surface and this will help in forming low resistance non-alloyed ohmic contacts to the InGaSb.

Figure 2:
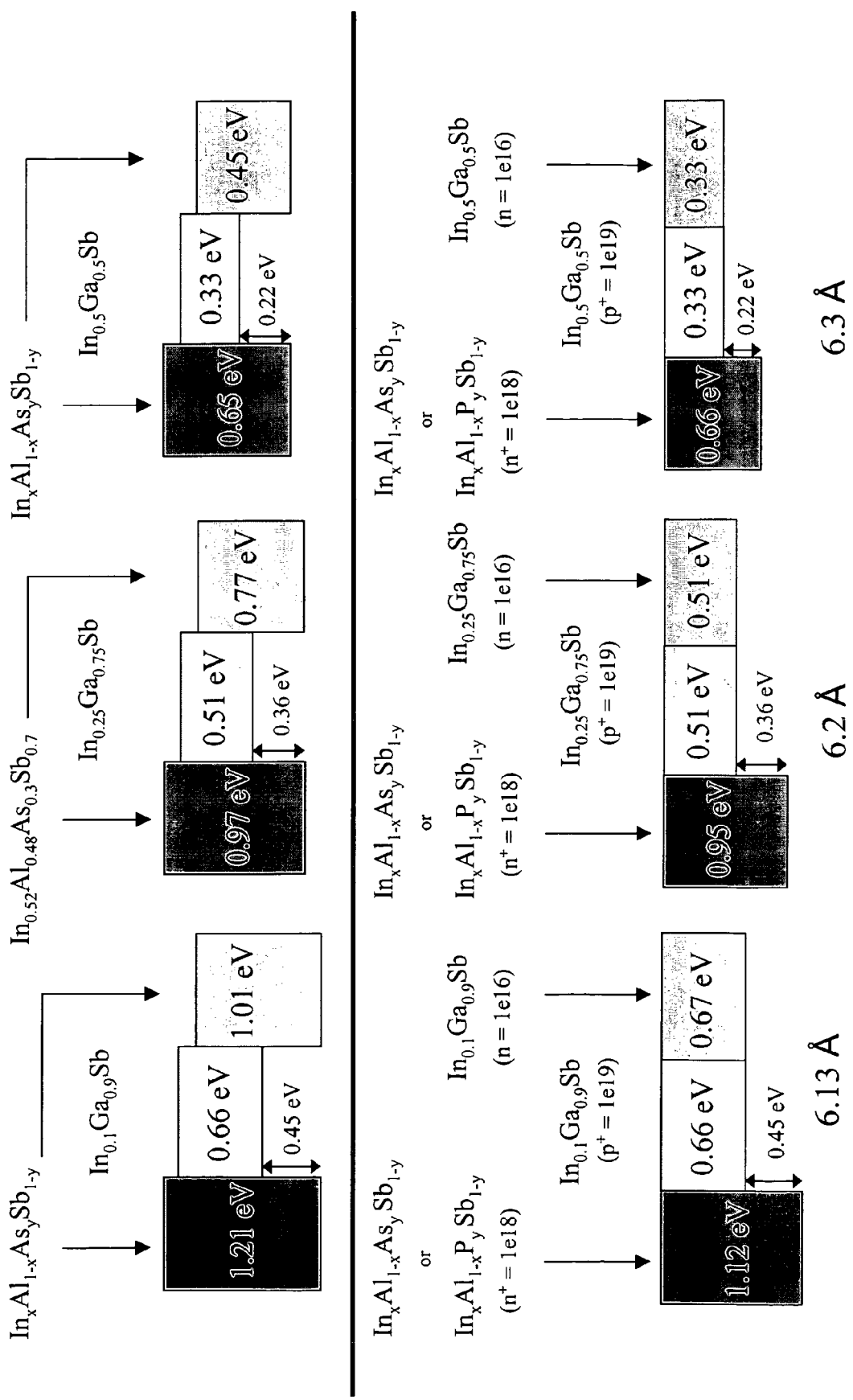
FIG. 2 is a band diagram of the antimony-based heterojunction bipolar transistors of this invention.

In reference to fabrication of the HBT devices, the HBT materials can be grown metamorphically on a GaSb or semi-insulating, GaAs or Inp substrate by molecular beam epitaxy. They may also be grown by other epitaxial methods such as organo metallic vapor deposition. After the growth of a thick AlSb buffer layer, a heavily doped n+ InAlAsSb, InAlPSb, InAsSb or InGaSb subcollector is grown, followed by a moderately doped n-type InAlAsSb, InAlPSb or InGaSb collector, then an p+ InGaSb base, followed by an InAlAsSb or InAlPSb emitter. Finally, an n+ InGaSb, InAs or InAsSb cap layer is grown above the emitter layer. The bandgaps and band alignments for these material combinations were obtained using data from 8-band k-p simulations, as illustrated in FIG. 2.

For a basic disclosure on the general fabrication of a device of this nature, see Boos et al U.S. Pat. No. 5,798,540 (??), the entire contents of which is incorporated herein.

InGaSb HBTs have some very attractive advantages compared to conventional GaAs or InP-based HBTs. The key features of this new design are the use of a narrow bandgap InGaSb base layer with either material for the emitter, and InAlAsSb, InAlPSb or InGaSb for the collector. The InGaSb base has a higher hole mobility and electron mobility than InGaAs or GaAsSb which are used for the base in HBTs lattice matched to InP. The higher hole mobility will result in lower resistance between the ohmic contact to the base layer and the emitter. Minimizing this resistance is important in obtaining high frequency operation. The high electron mobility in the base is also important as it leads to fast electron transit across the base from the emitter to the collector. This is also important for high frequency operation.

Another key advantage of this approach is the design flexibility gained by being able to optimize the conduction band offsets at the InAlAsSb/InGaSb or InAlPSb/InGaSb heterojunctions while maintaining a large valence band offset at one lattice constant for the complete HBT. An attractive feature of the InGaSb/InAlAsSb is that for a particular lattice constant, the valence band offset does not change very much with as the quaternary composition changes through its entire possible range, Over the composition range the quaternary band gap varies from 0.15 to about 1.5 eV. Because of the constant valence band offset the bandgap variation results in a large variation in the conduction band offset. Tuning the conduction band offsets at the emitter-base and collector-base contacts is important in optimizing device operation. This design flexibility results in higher emitter efficiency, higher current gain and improved electron transport through the transistor. The preliminary band diagrams that show how the composition of the InGaSb HBTs change when moving from a lattice constant of 6.13A to 6.3A, are shown in FIG. 2 to illustrate the large lattice constant window for optimization of this HBT.

In addition to the increased high-speed performance, InGaSb HBTs are also attractive for applications requiring low-collector voltage operation. The lower bandgap of InGaSb reduces the emitter-base voltage required to reach a given collector current density compared to InP and GaAs based HBTs. This leads to lower power dissipation than those HBTs.

The material growth and fabrication technology for InAlAsSb/InGaSb HBTs has been demonstrated. Better determination of the appropriate compositions and doping levels for the different layer structures are required to optimize performance. Leakage currents associated with growth defects near the emitter-base and base-collector junctions will need to be reduced. When using narrow bandgap collector material impact ionization in the collector will also need to be addressed.

HBT improved performance with these improved material design features was unexpected compared to InP-based and GaAs based HBTs. By being able to vary the alloy composition and thickness of the layer structure, a wide range of possibilities exist to exploit the use of these materials in the device. The unique combinations of these heterojunction materials make InGaSb HBTs attractive candidates in future technologies where high speed, gain, and efficiency at low bias voltage will be required.

While presently preferred embodiments have been shown for these novel heterojunction bipolar transistors, and of the several modifications discussed, persons skilled in this art will readily appreciate that various additional changes and modifications can be made without departing from the spirit of the invention, as defined and differentiated by the following claims.

What is claimed:

1. An electronic device comprising a semiconductor substrate, wherein said semiconductor substrate is selected from the group consisting of GaSb, GaAs, and InP, an undoped buffer layer deposited on said substrate, a sub-collector layer deposited on said buffer layer wherein said sub-collector layer is selected from the group consisting of InAlAsSb, InAlPSb, InAsSb and InGaSb, a collector layer deposited on said sub-collector layer wherein said collector layer is selected from the group consisting of InAlAsSb, InAlPSb and InGaSb, an InGaSb base layer deposited on said collector layer, an emitter layer of antimony-based material deposited on said base layer, and a highly doped cap layer deposited on said emitter layer wherein said doping is on the order of about $1 \times 10^{19}/cm^3$ tellurium or silicon wherein said cap layer is selected from the group consisting of InGaSb, InAs and InAsSb;
- wherein the InGaSb base layer band-gap is from about 0.3 to about 0.7 eV for optimum low voltage operation at emitter-base voltages from about 0.1 to about 0.5 V;
- wherein the lattice constant is from about 6.1 to about 6.3 Å; and
- wherein the InAlAsSb or InAlPSb quaternary band gap varies from about 0.15 to about 1.5 eV.

2. The device of claim 1 wherein said buffer layer includes undoped layer of InAlAsSb, InAlSb, or step or continuously graded InAlAsSb, InAlSb, with portions containing short period superlattice structures.

3. The device of claim 2 that can have frequency on the order of 500 GHz and a reduced power dissipation, wherein thickness of the various components is as follows:
- substrate, 475 to 525 μm;
- buffer layer, 1 to 3 μm;
- sub-collector layer, 2000-8000 Å;
- collector layer, 2000-8000 Å
- base layer, 200-800 Å
- emitter layer, 1000-4000 Å, and
- cap layer, 100-500 Å.

4. An electronic device comprising a semiconductor substrate, wherein said semiconductor substrate is InP, a buffer layer deposited on said substrate, an InAlPSb sub-collector layer deposited on said buffer layer, an InAlPSb collector layer deposited on said sub-collector layer, an InGaSb base layer deposited on said collector layer, an emitter layer of antimony-based material deposited on said base layer, and a highly doped cap layer deposited on said emitter layer wherein said doping is on the order of about $1 \times 10^{19}/cm^3$ tellurium or silicon wherein said cap layer is selected from the group consisting of InGaSb, InAs and InAsSb.

5. The device of claim 4 wherein said buffer layer includes undoped layer of InAlAsSb, InAlSb, or step or continuously graded InAlAsSb, InAlSb, with portions containing short period superlattice structures.

6. The device of claim 5 that can have frequency on the order of 500 GHz and a reduced power dissipation, wherein thickness of the various components is as follows:
- substrate, 475 to 525 μm;
- buffer layer, 1 to 3 μm;
- sub-collector layer, 2000-8000 Å;
- collector layer, 2000-8000 Å,
- base layer, 200-800 Å
- emitter layer, 1000-4000 Å, and
- cap layer, 100-500 Å.

* * * * *

UNITED STATES PATENT AND TRADEMARK OFFICE
CERTIFICATE OF CORRECTION

PATENT NO. : 7,635,879 B2  Page 1 of 1
APPLICATION NO. : 11/239438
DATED : December 22, 2009
INVENTOR(S) : Boos et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 321 days.

Signed and Sealed this

Ninth Day of November, 2010

David J. Kappos
*Director of the United States Patent and Trademark Office*